US010622952B2

(12) United States Patent
Shveshkeyev (10) Patent No.: US 10,622,952 B2
(45) Date of Patent: Apr. 14, 2020

(54) DISTRIBUTED AMPLIFIER

(71) Applicant: Microsemi Corporation, Aliso Viejo, CA (US)

(72) Inventor: Peter Shveshkeyev, Londonderry, NH (US)

(73) Assignee: Microsemi Corporation, Chandler, AZ (US)

( * ) Notice: Subject to any disclaimer, the term of this patent is extended or adjusted under 35 U.S.C. 154(b) by 0 days.

(21) Appl. No.: 16/002,059

(22) Filed: Jun. 7, 2018

(65) Prior Publication Data

US 2019/0379337 A1 Dec. 12, 2019

(51) Int. Cl.
*H03F 3/60* (2006.01)
*H03F 1/52* (2006.01)
*H03F 3/193* (2006.01)

(52) U.S. Cl.
CPC ............ *H03F 1/523* (2013.01); *H03F 3/193* (2013.01); *H03F 2200/315* (2013.01); *H03F 2200/426* (2013.01); *H03F 2200/451* (2013.01)

(58) Field of Classification Search
CPC .. H03G 3/30; H03F 1/303; H03F 3/21; H03F 1/0261; H03F 3/19
USPC .......................................... 330/298, 286, 54
See application file for complete search history.

(56) References Cited

U.S. PATENT DOCUMENTS

| 4,733,195 A * | 3/1988 | Tserng | H03F 3/607 330/286 |
| 5,300,897 A * | 4/1994 | Shiga | H02H 9/045 330/207 P |
| 7,498,883 B2 * | 3/2009 | Wu | H03F 3/602 330/286 |
| 7,782,140 B2 * | 8/2010 | Shigematsu | H03B 5/1852 330/286 |
| 9,825,603 B2 * | 11/2017 | Kobayashi | H03F 3/604 |

FOREIGN PATENT DOCUMENTS

| EP | 2420858 A1 | 2/2012 |
| WO | 2007035777 A3 | 5/2009 |

OTHER PUBLICATIONS

Skyworks Application Note; "PIN Limiter Diodes in Receiver Protectors"; Published Aug. 15, 2008 by Skyworks Solutions, Inc., Woburn, MA.

(Continued)

*Primary Examiner* — Khanh V Nguyen
*Assistant Examiner* — Khiem D Nguyen
(74) *Attorney, Agent, or Firm* — Glass and Associates; Kenneth Glass (57) ABSTRACT

A distributed amplifier system constituted of: an input transmission line exhibit a plurality of sections; an output transmission line; an amplifier stage, an output of the amplifier stage coupled to the output transmission line and an input of the amplifier stage coupled to the input transmission line between a respective pair of the plurality of sections; a PIN diode coupled between a first end of the input transmission line and a common potential; and a circuitry coupled between a second end of the input transmission line and the common potential, the second end opposing the first end, such that there is a direct current (DC) flow through the first unidirectional electronic valve, the input transmission line and the circuitry.

9 Claims, 5 Drawing Sheets

(56) References Cited

OTHER PUBLICATIONS

Skyworks Application Note; "Design with PIN Diodes"; Published Oct. 22, 2012 by Skyworks Solutions, Inc., Woburn, MA.
Chin Leong Lim; "LNA Integrates Fast Shutdown Function"; Published Dec. 2014 in Microwaves & RF, pp. 84-88.
International Search Report and Written Opinion, PCTAJS2019/027390, dated Jul. 5, 2019.
Timothy Fox, Richard Giacchino; "A Flip-Chip Single-Pole Three-Throw Switch with Integrated Bypass LNA for WLAN Applications", Proceedings of the 2nd European Wireless Technology Conference, Sep. 28-29, 2009.
Ma Y et al: "InGaP/GaAs HBT DC-20GHz distributed amplifier with compact ESD protection circuits", Journal of Electrostatics, Elsevier Science Publishers B.V. Amsterdam, NL, vol. 64, No. 2, Feb. 1, 2006 (Feb. 1, 2006) pp. 88-95, XP027884386, ISSN: 0304-3886 [retrieved on Feb. 1, 2006].
Xizhen Tian et al: "Noise performance of a preamplifier for high-speed optical receiver front-ends", Canadian Journal of Electrical and Computer Engineering/Revue Canadienne De Genie Electrioue And Informatioue, Engineering, USA, vol. 28, No. 1, Dec. 1, 2005 (Dec. 1, 2005), pp. 49-54, XP011183173, ISSN: 0840-8688, DOI: 10.1109/CJECE.2005.1532606.

* cited by examiner

DISTRIBUTED AMPLIFIER

TECHNICAL FIELD

The present application relates to the field of distributed amplifiers, and particularly to a system and method of protecting high frequency distributed amplifiers.

BACKGROUND OF THE INVENTION

Receivers at the front end of today's radars are faced with increasing bandwidth requirements and increasingly hostile environments. In order to address these issues, microwave differential amplifiers (MWDA) are placed at the radar front end. The MWDAs are low-noise and provide very good matching and high linearity, at relatively high radio frequency (RF) and microwave power levels at its input. Although capable of handling high power levels, additional protection circuits are required in case the input signal becomes extremely high. Such high signals can cause damage to the transistors in the amplifier stages of the MWDA.

SUMMARY

In view of the discussion provided above and other considerations, the present disclosure provides methods and apparatus to overcome some or all of the disadvantages of prior art distributed amplifiers. This is provided in one embodiment by a differential amplifier comprising: an input transmission line exhibit a plurality of sections; an output transmission line; at least one amplifier stage, an output of each of the at least one amplifier stage coupled to the output transmission line and an input of each of the at least one amplifier stage coupled to the input transmission line between a respective pair of the plurality of sections; a protection circuitry coupled between a first end of the input transmission line and a common potential, the protection circuitry comprising a PIN diode; and a resistance circuitry coupled between a second end of the input transmission line and the common potential, the second end opposing the first end, such that there is a direct current (DC) flow through the PIN diode, the input transmission line and the resistance circuitry.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

DETAILED DESCRIPTION OF PREFERRED EMBODIMENTS

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

Figure 1A:
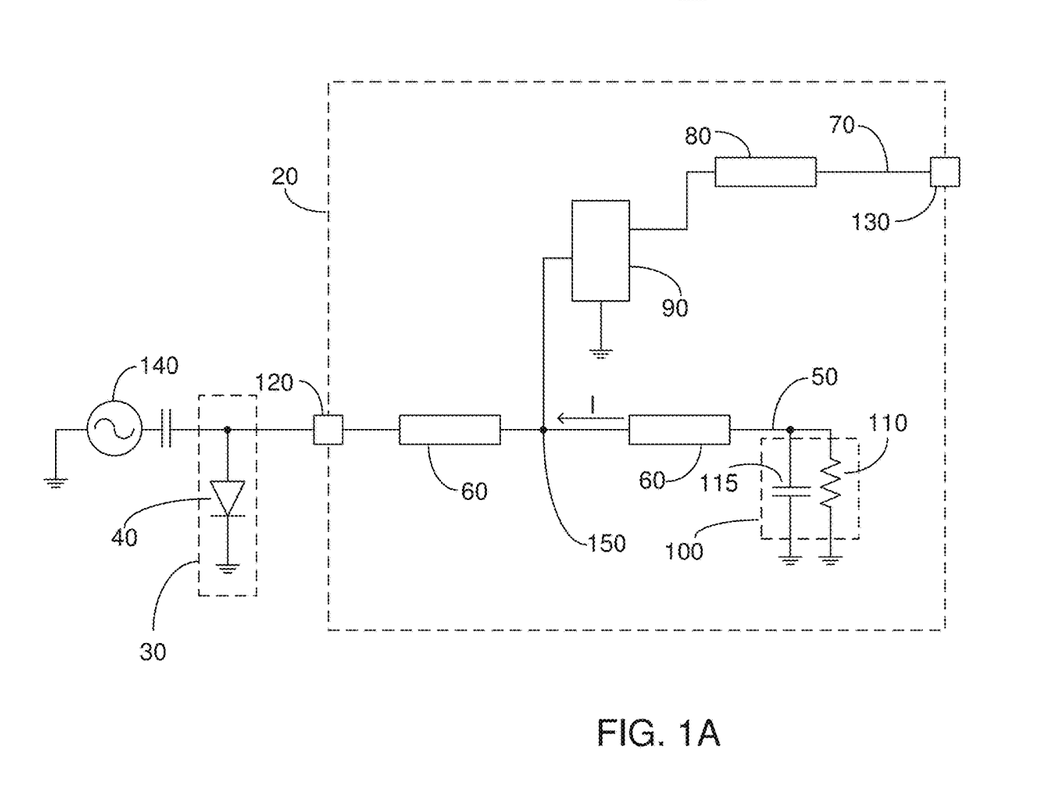
FIG. 1A illustrates a high level schematic diagram of a distributed amplifier system comprises a distributed amplifier and a first protection circuitry, in accordance with certain embodiments.
Figure 1B:
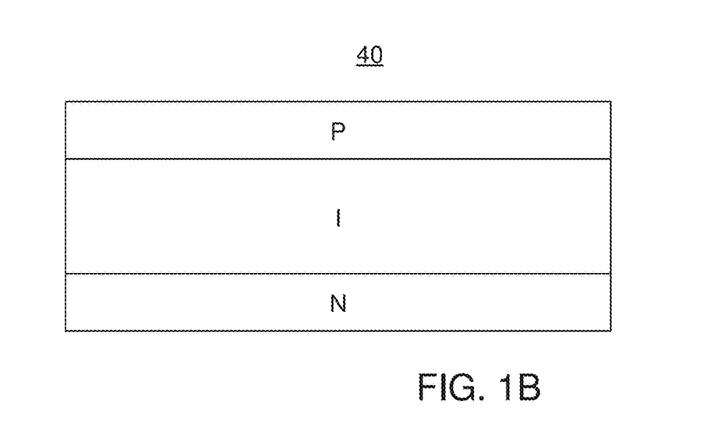
FIG. 1B illustrates a high level block diagram of a PIN diode.

FIG. 1A illustrates a high level schematic diagram of a distributed amplifier system 10, in accordance with certain embodiments. Distributed amplifier system 10 comprises: a distributed amplifier 20; and a protection circuitry 30 comprising a PIN diode 40. Distributed amplifier 20 comprises: an input transmission line 50 comprising a plurality of sections 60; an output transmission line 70 comprising a section 80; an amplifier stage 90; a circuitry 100 comprising a resistor 110 in parallel with a capacitor 115; an input terminal 120; and an output terminal 130. Further illustrated is a high frequency signal coupled between a common potential and the nexus of input terminal 120 and an anode of PIN diode 40 via a DC blocking capacitor. A PIN diode is a diode with an intrinsic semiconductor region between a p-type semiconductor and an n-type semiconductor region. Distributed amplifier is illustrated as comprising a pair of sections 60 on input transmission line 50, a single section 80 on output transmission line 70 and a single amplifier stage 90, however this is not meant to be limiting in any way. In another embodiment, a plurality of amplifier stages 90 is provided and the number of sections 60 and sections 80 are increased accordingly. In one embodiment, high frequency signal source 140 provides a radio frequency (RF) signal or a microwave frequency, which may be sourced by an antenna. FIG. 1B illustrates a high level block diagram of PIN diode 40, FIGS. 1A-1B being described together.

The anode of PIN diode 40 is coupled to input terminal 120 and to high frequency signal source 140. A cathode of PIN diode 40 is coupled to a common potential. Input terminal 120 is coupled to a first end of input transmission line 50. An input of amplifier stage 90, at a first terminal thereof, is coupled to a junction 150 of input transmission line 50, junction 150 being between the first and second sections 60. First section 60 is between junction 150 and input terminal 120 and second section 60 is between junction 150 and a second end of input transmission line 50, the second end of input transmission line 50 opposing the first end of input transmission line 50. A first end of each of resistor 110 and capacitor 150 of circuitry 100 is coupled to the second end of input transmission line 50, and a second end of each of resistor 110 and capacitor 150 is coupled to the common potential. An output of amplifier stage 90, at a second terminal thereof, is coupled to section 80 of output transmission line 70. Section 80 is between the output of amplifier stage 90 and output terminal 130. A third terminal of amplifier stage 90 is coupled to the common potential. Although, PIN diode 40 is illustrated where the anode is coupled to input terminal 120 this is not meant to be limiting in any way and in another embodiment the cathode of PIN diode 40 is coupled to input terminal 120.

In operation, a high frequency signal is output by high frequency signal source 140 which is received at the input of amplifier stage 90 at junction 150. Amplifier stage 90 amplifies the received signal which is then output at output terminal 130, as known to those skilled in the art at the time of the invention and as will be further described below. As long as the signal from high frequency signal source 140 exhibits a peak positive voltage below a predetermined threshold value, PIN diode 40 will have no effect. The power of the signal is determined as $V^2/R$, where R is the sum of impedance of first and section 60 (typically 50 ohms for each section 60), and thus there is a direct relationship between the peak position voltage of the RF signal and the power of the RF signal.

In the event that the signal from high frequency signal source 140 exhibits a peak positive voltage greater than the predetermined threshold value, the depletion region of PIN diode 40 will collapse and current will begin to flow therethrough, thereby limiting the amount of power allowed into distributed amplifier 20. When PIN diode 40 is reverse biased, during the negative half of the cycle of high frequency signal source 140, the intrinsic region discharges thereby providing reverse current flow. PIN diode 40 is selected such that the discharge time is longer than the period of the signal provided by high frequency signal source 140. As a result, power limiting is provided for the entirety of the signal cycle by the resistance of PIN diode 40. During the positive half of the signal cycle, the voltage is limited across pin diode 40, and this clipping results in an average reverse self bias across PIN diode 40.

In addition to the power limitation, when PIN diode 40 is conducting, a direct current (DC) path is created through PIN diode 40 to resistor 110, via the common potential, held by capacitor 115, and through input transmission line 50. Thus a DC potential is presented to the input of amplifier stage 90 at junction 150 and a negative DC potential appears at input terminal 120. Particularly, a DC current, denoted I, smoothed by capacitor 115, flows through PIN diode 40 from the anode to cathode, through the common potential and through resistor 110 into input transmission line 50. The polarity of PIN diode 40 and the properties of amplifier stage 90 are arranged such that the generated DC potential shuts off amplifier stage 90, as will be described further below.

Thus, in the event of an input signal from high frequency signal source 140 whose voltage exceeding a predetermined threshold value, distributed amplifier 20 shuts off until the voltage returns to an acceptable level, reflecting an appropriate power level. Upon reaching the acceptable voltage level, PIN diode 40 will cease conducting and the DC potential will be removed from junction 150. In some further detail, PIN diode 40 acts as a limiter through reflection of RF power back to signal source 140 by effectively creating a short circuit when conducting DC current under high power conditions. This DC current flows through resistor 110 and creates a DC voltage on junction 150 which is held by capacitor 115. For a typical silicon PIN diode implementation of PIN diode 40, PIN diode 40 begins conducting when the power of signal source 140 reaches 17-20 dBm, and any further increase of power from signal source 140 will result in an increased DC current through PIN diode 40, resulting in a more negative voltage at junction 150. In one embodiment, when the power from signal source 140 is at 20 dBm about 1-2 mA of current will flow, and when the power from signal source 140 increases to 27-30 dBm this current will increase to about 20-30 mA, however the effective RF voltage appearing across PIN diode 40 will remain fixed at a peak of 1-1.5 V, responsive to the limiting power capability of PIN diode 40. Thus, as the self-bias across PIN diode 40 increases due to the increased signal power, the amplification of amplifier stage 90 is reduced.

Figure 1C:
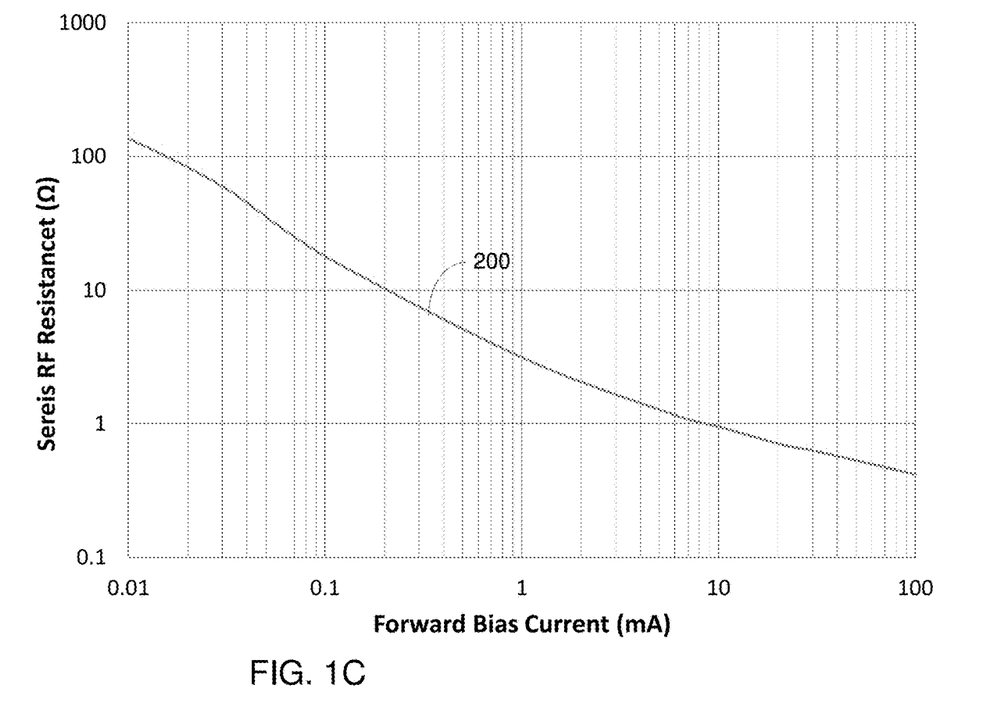
FIG. 1C illustrate a graph of a resistance of a PIN diode.

An additional advantage of using PIN diode 40 for protection circuitry 30 is that PIN diodes can sink a significant amount of current while presenting a relatively low shunting capacitance in the off state. Furthermore, in the RF and microwave ranges, PIN diodes behaves like a linear resistor, as illustrated in the example of graph 200 in FIG. 1C, where the x-axis denotes the forward bias current magnitude of PIN diode 40 and the y-axis denotes the series RF resistance of PIN diode 40. As illustrated in graph 200, the change in resistance as a function of the forward bias current magnitude is similar to that of a linear parametric resistor, and as a result harmonics are not created as is the case with voltage clipping diodes, such as PN or Schottky diodes. It is linear parametric resistor, i.e. a linear resistor whose value is responsive to the value of the DC current flowing through it.

Figure 2A:
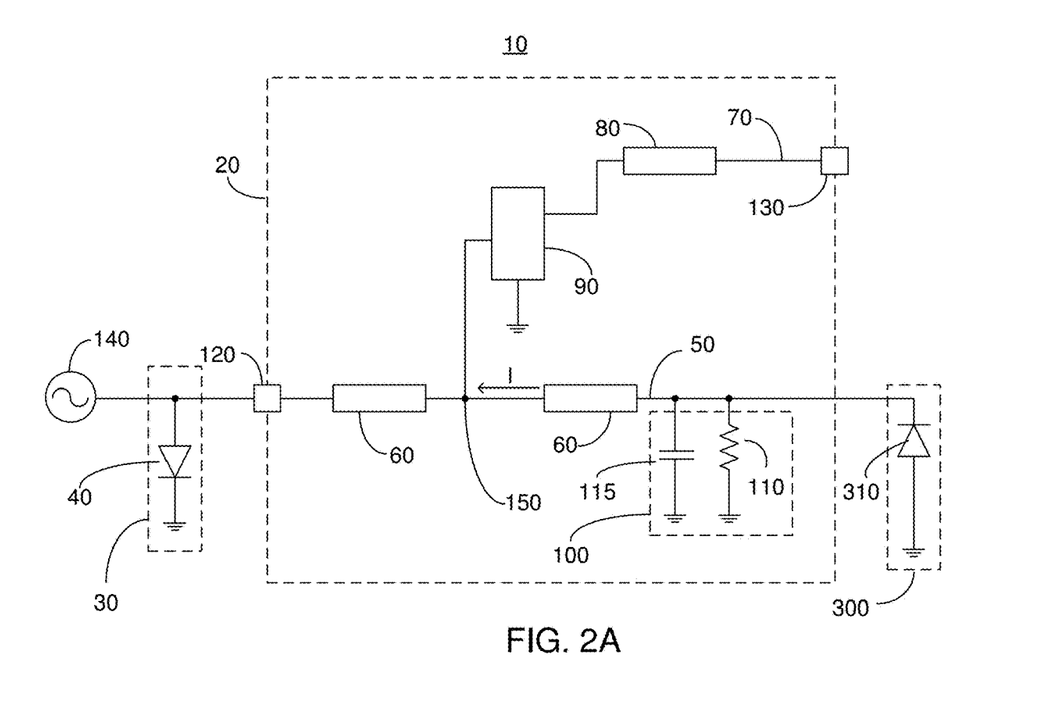
FIG. 2A illustrates a high level schematic diagram of the distributed amplifier system of FIG. 1, further comprising a second protection circuitry.
Figure 2B:
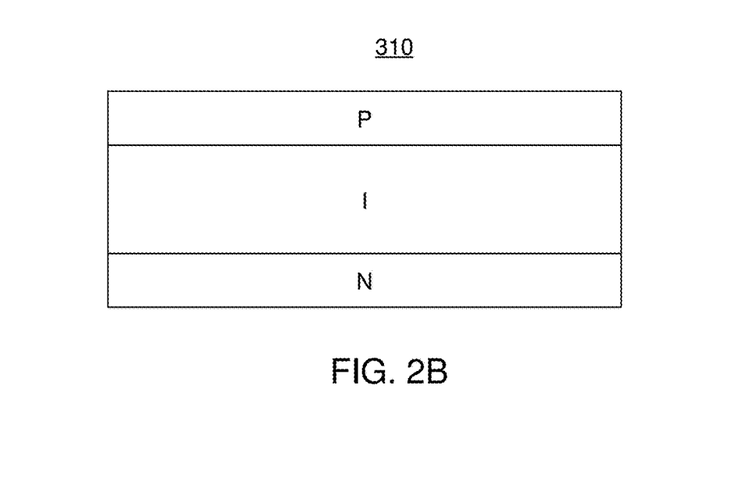
FIG. 2B illustrates a high level block diagram of a PIN diode.

FIG. 2A illustrates a high level schematic diagram of distributed amplifier system 10 further comprising a second protection circuit 300. Second protection circuit 300 comprises a unidirectional electronic valve 310 whose polarity opposes the polarity of PIN diode 40. In one preferred embodiment, unidirectional electronic valve 310 is a PIN diode and is described herein as such. FIG. 2B illustrates a high level block diagram of PIN diode 310, FIGS. 2A-2B being described together. A cathode of PIN diode 310 is coupled to the first end of resistor 110 and an anode of PIN diode 310 is coupled to the common potential.

Figure 2C:
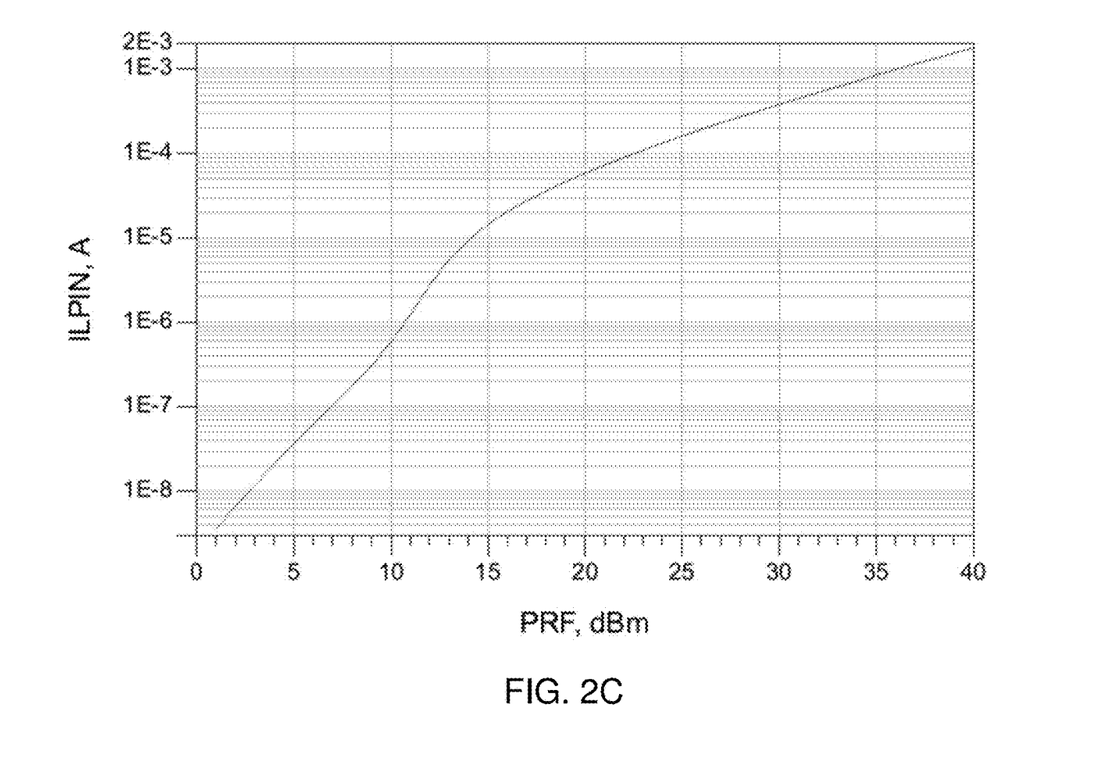
FIG. 2C illustrate a graph of a generated DC current, in accordance with certain embodiments.

As described above, when the voltage of the input signal from high frequency signal source 140 exceeds a predetermined threshold value, PIN diode 40 begins to conduct and a DC potential is presented at junction 150 of input transmission line 50. Graph 400 of FIG. 2C illustrates the magnitude of DC current I, where the x-axis represents the power output by high frequency signal source 140 in dBm and the y-axis represents the magnitude of current I in Amperes. As illustrated by graph 400, the magnitude of DC current I increases rapidly in response to an increase in the power output by high frequency signal source 140. In order to avoid damaging amplifier stage 90, the DC potential at junction 150 should preferably be limited. Thus, in the event that the magnitude of DC current I exceeds a predetermined value, the negative potential at the cathode of PIN diode 310 will exceed the threshold voltage of PIN diode 310 and PIN diode 310 will begin to conduct thus limiting the range of negative voltage appearing at the second end of input transmission line 50.

Figure 3A:
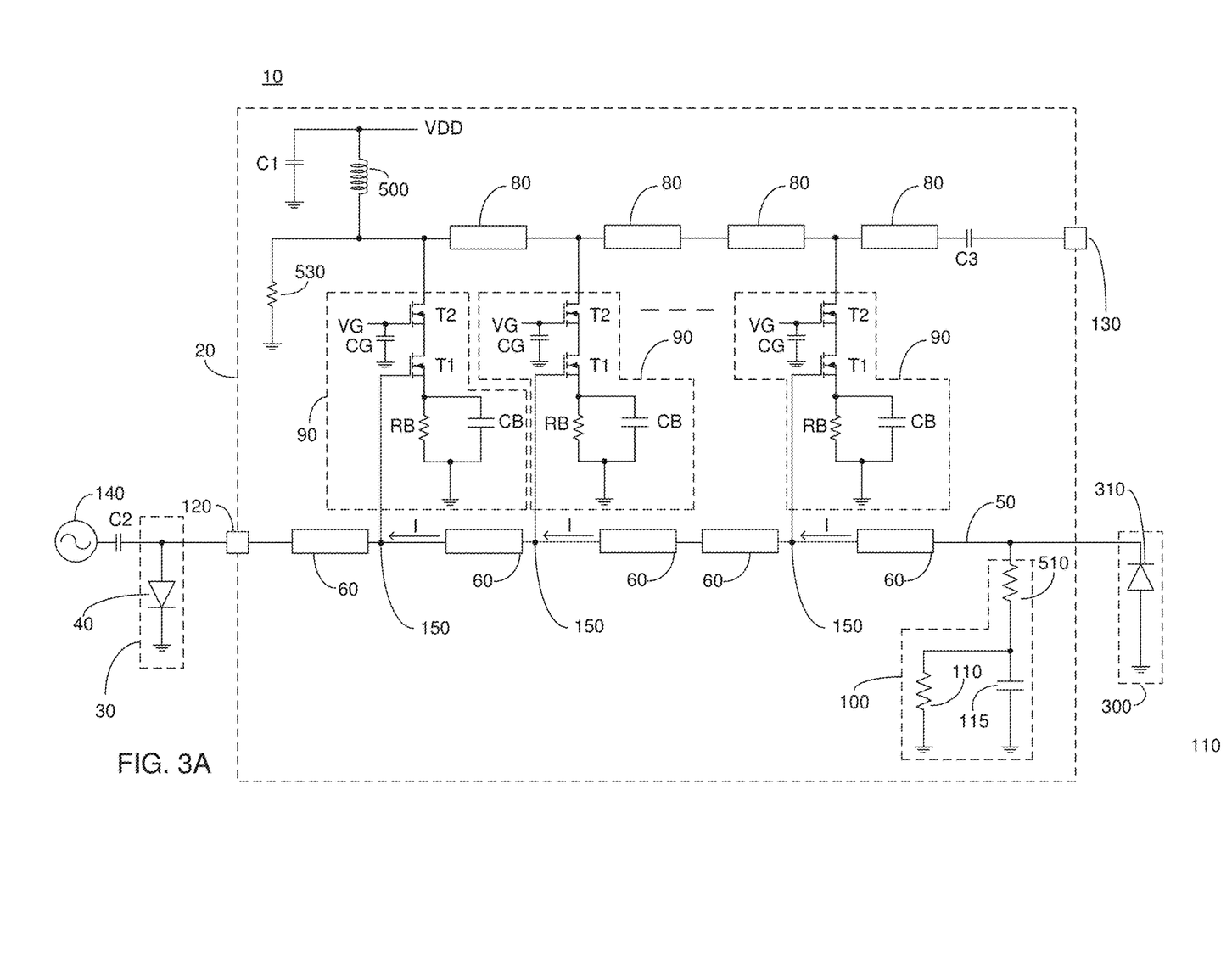
FIG. 3A illustrates a more detailed embodiment of the distributed amplifier system of FIG. 2.

FIG. 3A illustrates a more detailed embodiment of distributed amplifier system 10. Specifically, illustrated is a plurality of amplifier stages 90, each amplifier stage 90 comprising: a first pseudomorphic high electron mobility field effect transistor (PHEMT FET) T1; a second PHEMT FET T2; a resistor RB; a capacitor CB; and a capacitor CG. Each additional amplifier stage 90 is provided with a respective section 60 on input transmission line 50 and a respective section 80 on output transmission line 70. Additionally provided is an RF/microwave choke 500 and a plurality of DC blocking capacitors C1, C2 and C3. Circuitry 100 comprises: resistor 110, a resistor 510; and capacitor 115. A resistor 530 is also provided. Amplifier stages 90 are each illustrated and described herein as comprising PHEMT FETs, however this is not meant to be limiting in any way and other transistor types may be provided without exceeding the scope. Additionally, amplifier stages 90 are each illustrated and described herein as comprising two transistors, however this is not meant to be limiting in any way. Second protection circuit 300 comprising unidirectional electronic valve 310 is further provided.

The source of each transistor T1 is coupled to a first end of each of the respective resistor RB and capacitor CB. A second end of each resistor RB and capacitor CB is coupled to the common potential. The gate of each transistor T1 is coupled to a respective junction 150. The drain of each transistor T1 is coupled to the source of the respective transistor T2. The gate of each transistor T2 is coupled to a first end of the respective capacitor CG and a gate voltage denoted VG. A second end of the respective capacitor CG is coupled to the common potential. The drain of each transistor T2 is coupled to the output transmission line between a respective pair of sections 80, with the exception of the first amplifier stage 90 which is coupled between the first section 80, a first end of RF/microwave choke 500 and a first end of resistor 530. A second end of RF/microwave choke 500 is coupled to a first end of DC blocking capacitor C1 and to a main supply voltage, denoted VDD. A second end of each of DC blocking capacitor C1 and resistor 530 is coupled to the common potential. DC blocking capacitor C2 is placed between high frequency signal source 140 and the anode of PIN diode 40. DC blocking capacitor C3 is placed between the last section 80 of output transmission line 70 and output terminal 130. Each of resistor 110 and capacitor 115 is coupled, in parallel, between the second end of resistor 510 and the common potential. The first end of resistor 510, and the cathode of diode 310 are coupled to the second end of input transmission line 50. Resistor 510 is typically set at 50 ohms, and acts as an RF terminal load for transmission line 60. Thus, resistor 510 provided termination and the parallel combination of resistor 100 and capacitor 115 provides the DC level for shut of amplifier stages 90. Diode 310 prevents DC voltage spikes beyond the sustainable level of transistors T1, T2.

In operation, transistors T1 and T2 of each amplifier stage 90 are biased by voltage VDD and the respective resistor RB. Particularly, a DC current flows from output transmission line 70 through transistors T1 and T2, and through resistor RB. The voltage drop across resistor RB provides the desired DC bias for transistor T1. Advantageously, biasing transistor T1 across resistor RB provides a negative feedback loop for maintaining a fixed DC current flowing through transistors T1 and T2. For example, responsive to an increase in the magnitude of the current, e.g. due to temperature variations, the voltage across resistor RB will increase accordingly. As a result, the gate-source voltage of transistor T1 will be reduced, thereby reducing the magnitude of the current flow therethrough.

The gates of transistors T1 are controlled by the respective high frequency potential at the respective junction 150 received from high frequency signal source 140 and the signal is amplified by the transistor cascade arrangement, as known to those skilled in the art at the time of the invention. As described above, in the event that the voltage level exceeds a predetermined threshold value, PIN diode 40 turns on thereby limiting the power output to distributed amplifier 20 and generating flow of DC current I through input transmission line 50, thus generating a negative voltage across capacitor 115. The respective negative potential generated at each junction 150, shuts off the respective transistor T1, as described above. Particularly, as described above, the potential at each junction 150 is negative, thereby providing a negative gate-source voltage at the respective transistor T1, which shuts off transistor T1.

In one non-limiting example, the pinch-off voltage of each transistor T1 is −1V and maximum allowable safe voltage level at the gate of each transistor T1 is −2.5V. The maximum power allowed at the input to distributed amplifier 20 is 12 dBm, or about 1.3V of voltage swing for an output resistance of 50Ω at the output of high frequency signal source 140. Therefore, if a DC pinch off voltage of −1V is applied to the gate of transistor T1, the actual gate voltage, including the high frequency voltage swing, will be −2.3V, which does not exceed the maximum of −2.5V.

Figure 3B:
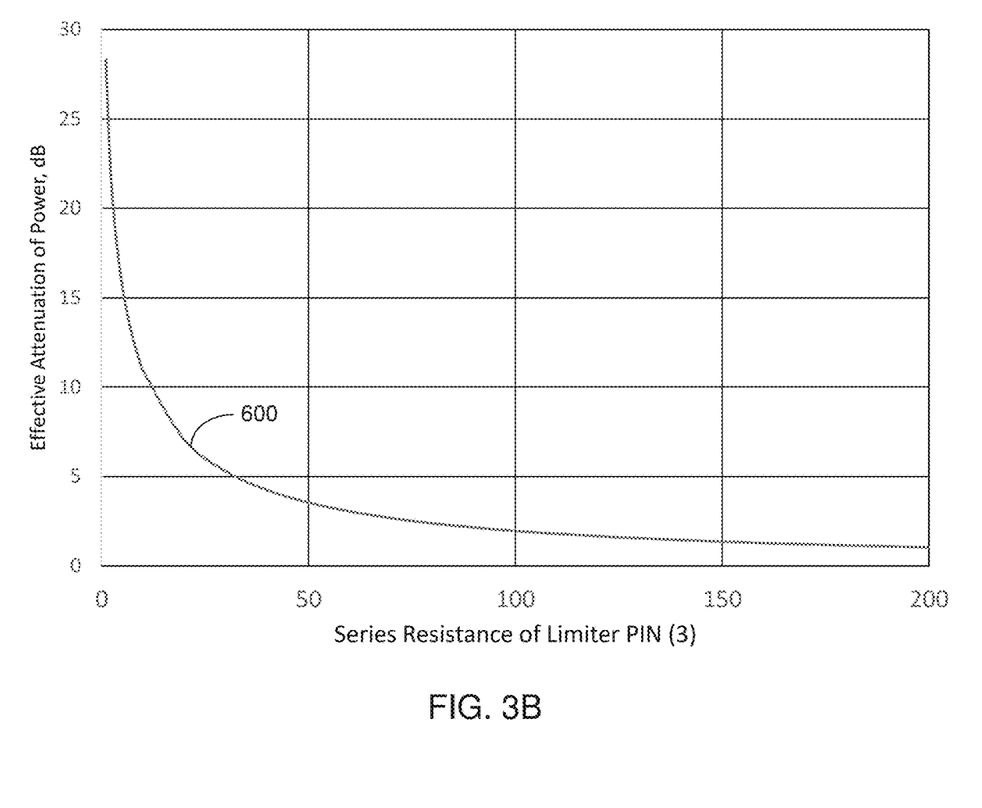
FIG. 3B illustrates a graph of the effective power attenuation of the protection circuit of the distributed amplifier system of FIG. 3A.

Graph 600 of FIG. 3B illustrates the effective power attenuation produced by PIN diode 40 as a function of the series resistance, where the x-axis represents the series resistance of PIN diode 40 and the y-axis represents power attenuation in dBm. As illustrated by graph 600, a series resistance of approximately 10 ohms provides more than 10 dB of attenuation. As illustrated in graph 200 of FIG. 1C, such a series resistance is achieved in the present non-limiting example with a current value, whose amplitude is approximately 0.2 mA. Therefore, in order to provide a voltage of −1V at the gates of transistors T1, the series resistance of resistors 110 and 510 should equal approximately 5 kΩ However, a large resistance can increase the charge/discharge time of the RC network of resistor 510 and capacitor 520. Therefore, a lower resistance may be desired.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and sub-combinations of the various features described hereinabove as well as variations and modifications thereof which would occur to persons skilled in the art upon reading the foregoing description and which are not in the prior art.

I claim:

1. A distributed amplifier system comprising:
   an input transmission line exhibiting a plurality of sections; an output transmission line;
   an amplifier stage, an output of said amplifier stage coupled to said output transmission line and an input of said amplifier stage coupled to said input transmission line between a respective pair of said plurality of sections;
   a PIN diode coupled between a first end of said input transmission line and a common potential;
   a circuitry comprising a resistor and a capacitor coupled between a second end of said input transmission line and the common potential, said second end opposing said first end, such that there is a direct current (DC) flow through said PIN diode, said input transmission line and said resistor of said circuitry when a signal received at said input transmission line exceeds a predetermined threshold; and
   a protection circuitry, said protection circuitry comprising a unidirectional electronic valve coupled between said second end of said input transmission line and the common potential, a polarity of said unidirectional electronic valve opposing a polarity of said PIN diode.

2. The distributed amplifier system of claim 1, wherein said unidirectional electronic valve comprises a protection circuitry PIN diode.

3. The distributed amplifier system of claim 1 further comprising:
   wherein said amplifier stage exhibits a first terminal and a second terminal,
   wherein said first terminal constitutes said input of said amplifier stage and said second terminal constitutes said output of said amplifier stage, and
   wherein a bias resistor shunted by a capacitor is coupled between circuitry in the amplifier stage and the common potential.

4. The distributed amplifier system of claim 3, wherein said amplifier stage shuts off responsive to said DC flow having an amplitude exceeding a predetermined value.

5. A method of controlling a distributed amplifier system comprising:
   providing a series connection of PIN diode and a resistor coupled between a first end of an input transmission line and a second end of the input transmission line; and
   providing a capacitor in parallel with the resistor, such that there is a direct current (DC) flow through said PIN diode, said input transmission line and said provided resistor when a signal received at said input transmission line exceeds a predetermined threshold; and
   providing a protection circuitry, said protection circuitry comprising a unidirectional electronic valve coupled between said second end of said input transmission line and the common potential, a polarity of said unidirectional electronic valve opposing a polarity of said PIN diode such that a potential of the second end of said transmission line can not exceed a predetermined negative value.

6. The method of claim 5, wherein at least one amplifier stage of the distributed amplifier system shuts off responsive to said DC flow having an amplitude exceeding a predetermined value.

7. The method of claim 5, wherein a discharge time of said PIN diode is longer than a period of the signal received at said input transmission line.

8. The distributed amplifier system of claim 1, wherein a discharge time of said PIN diode is longer than a period of the signal received at said input transmission line.

9. The method of claim 5, wherein said unidirectional electronic valve of said provided protection circuitry comprises a protection circuitry PIN diode.

* * * * *